United States Patent
Koo et al.

(10) Patent No.: US 10,988,843 B2
(45) Date of Patent: Apr. 27, 2021

(54) SYSTEM FOR DETERMINING CLEANING PROCESS ENDPOINT

(71) Applicant: Applied Materials, Inc., Santa Clara, CA (US)

(72) Inventors: Il-Woong Koo, North Andover, MA (US); Cuiyang Wang, Andover, MA (US); Peter G. Ryan, Jr., Gloucester, MA (US); Jun Seok Lee, Andover, MA (US)

(73) Assignee: Applied Materials, Inc., Santa Clara, CA (US)

( * ) Notice: Subject to any disclaimer, the term of this patent is extended or adjusted under 35 U.S.C. 154(b) by 33 days.

(21) Appl. No.: 16/526,310

(22) Filed: Jul. 30, 2019

(65) Prior Publication Data

US 2021/0032746 A1 Feb. 4, 2021

(51) Int. Cl.
*C23C 16/44* (2006.01)
*G06K 9/62* (2006.01)
*G05B 23/02* (2006.01)

(52) U.S. Cl.
CPC ...... *C23C 16/4405* (2013.01); *G05B 23/0221* (2013.01); *G06K 9/6289* (2013.01)

(58) Field of Classification Search
CPC ............ C23C 16/4405; G05B 23/0221; G06K 9/6289
See application file for complete search history.

(56) References Cited

U.S. PATENT DOCUMENTS

| | | |
|---|---|---|
| 2005/0139232 A1 | 6/2005 | Choi |
| 2007/0079758 A1 | 4/2007 | Holland et al. |
| 2008/0251104 A1 | 10/2008 | Chen et al. |
| 2011/0087378 A1 | 4/2011 | Kim |

FOREIGN PATENT DOCUMENTS

| | | |
|---|---|---|
| KR | 10-2008-0056193 A | 6/2008 |
| KR | 10-2009-0028991 A | 3/2009 |

OTHER PUBLICATIONS

International Search Report and Written Opinion dated Oct. 27, 2020 in corresponding PCT application No. PCT/US2020/041193.

*Primary Examiner* — Yuechuan Yu

(74) *Attorney, Agent, or Firm* — Nields, Lemack & Frame, LLC

(57) ABSTRACT

A system for determining when a cleaning process has completed is disclosed. This system relies on an increase in the amount of gas in the processing chamber that occurs when the cleaning is complete. This increase in the amount of gas may be detected in several ways. In one embodiment, a downstream pendulum valve is used to maintain the pressure within the processing chamber at a predetermined value. An increase in the size of the opening in the pendulum valve is indicative of the amount of gas in the system. In another embodiment, a sensor may be used to monitor the pressure within the processing chamber, while the incoming and outgoing flow rates are held constant. An increase in the pressure is indicative of an increase in the amount of gas in the processing chamber. This increase in the amount of gas is used to terminate the cleaning process.

17 Claims, 8 Drawing Sheets

SYSTEM FOR DETERMINING CLEANING PROCESS ENDPOINT

FIELD

Embodiments of the present disclosure relate to a system and method for determining when the cleaning of a processing chamber has been completed.

BACKGROUND

The fabrication of a semiconductor device involves a plurality of discrete and complex processes. These processes may take place within a processing chamber. Over time, residual materials become deposited on the walls of the processing chamber. For example, in the case of an etching process, the etching byproducts may be released from the semiconductor workpiece and contact an interior surface of the processing chamber.

Over time, the amount of residual material deposited on the interior surfaces may become problematic. For example, this residual material may detach from these interior surfaces and contaminate the semiconductor workpiece that is being processed.

Therefore, it is common to periodically conduct a cleaning process. Typically, after the semiconductor workpiece has been removed, a cleaning gas, which includes a halogen species, is introduced into the processing chamber. The halogen species interacts with the residual material to create gaseous materials, which can be expelled through the vacuum pump.

In certain embodiments, it is advantageous to perform the cleaning process for an optimal duration. If the duration of the cleaning process is too short, all of the residual material may not be removed from the interior surfaces. However, if the duration of the cleaning process is too long, the halogen species may begin to attack the interior surfaces themselves, causing pitting and creating metallic particles.

In some cases, optical emission spectroscopy (OES) is used to determine when the cleaning process is complete. When the residual material has all been removed, the amount of free halogen gas increases. Each compound emits light energy when it reverts to the relaxed state from the excited state. The spectrum of this light energy is related to the compound being excited. Thus, when the amount of the halogen gas increases, the peak value at the wavelength associated with that halogen gas increases. An OES system can recognize this increase in free halogen gas and terminate the cleaning process. Alternatively, a residual gas analysis (RGA) system may be used. These systems use the mass/charge relationship to determine the composition of gas in a low pressure environment. Again, the RGA system can detect an increase in the amount of free halogen gas and terminate the cleaning process.

However, OES and RGA systems are expensive and, in some cases, impractical. Therefore, it would be beneficial if there were a system to determine when a cleaning process is complete without the use of an OES or RGA system. Further, it would be beneficial if this system was as accurate as these other types of systems.

SUMMARY

A system and method for determining when a cleaning process has completed is disclosed. This system relies on an increase in the amount of gas in the processing chamber that occurs when the cleaning is complete. This increase in the amount of gas may be detected in several ways. In one embodiment, a downstream pendulum valve is used to maintain the pressure within the processing chamber at a predetermined value. An increase in the size of the opening in the pendulum valve is indicative of the amount of gas in the system. In another embodiment, a sensor may be used to monitor the pressure within the processing chamber, while the incoming and outgoing flow rates are held constant. An increase in the pressure is indicative of an increase in the amount of gas in the processing chamber. The increase in the amount of gas is used to terminate the cleaning process.

According to one embodiment, a system for cleaning a processing chamber is disclosed. The system comprises the processing chamber; a gas source containing a cleaning gas; an inlet valve in communication with the gas source and the processing chamber to allow a flow of the cleaning gas from the gas source into the processing chamber; a vacuum pump; an outlet valve in communication with the processing chamber and the vacuum pump to allow a flow of cleaning gas from the processing chamber; a pressure sensor; and a controller, wherein the controller comprising a processing unit and a memory device, wherein the memory device comprises instructions, which when executed by the processing unit, enable the controller to: monitor a flow rate, or a parameter indicative of the flow rate, of the cleaning gas into or out of the processing chamber during a cleaning process; and terminate the cleaning process based on changes to the monitored flow rate or the parameter. In certain embodiments, terminating the cleaning process comprises disabling the flow of cleaning gas through the inlet valve or providing an alert to an operator. In some embodiments, the system can operate in a least two configurations, wherein in an upstream pressure control configuration, the pressure sensor is in communication with the inlet valve to maintain a pressure within the processing chamber, and wherein in a downstream pressure control configuration, the pressure sensor is in communication with the outlet valve to maintain the pressure within the processing chamber. In certain embodiments, in the downstream pressure control configuration, the controller is in communication with the outlet valve. In certain embodiments, the outlet valve supplies an output indicative of the flow rate through the outlet valve. In some embodiments, the outlet valve is a pendulum valve. In certain further embodiments, the output comprises a position of a pendulum plate, which defines a size of an opening in the pendulum valve and is indicative of the flow rate through the outlet valve. In some further embodiments, the memory device comprises instructions, which when executed by the processing unit, enable the controller to: monitor the position of the pendulum plate in the pendulum valve; determine that the position of the pendulum plate has started changing; and wait for the position of the pendulum plate to reach a new steady state value; wherein the controller terminates the cleaning process after the new steady state value is reached. In some embodiments, in the upstream pressure control configuration, the controller is in communication with the inlet valve. In some further embodiments, the memory device comprises instructions, which, when executed by the processing unit, enable the controller to: monitor a rate of gas flowing through the inlet valve; determine that the rate of gas flowing through the inlet valve has started decreasing; and wait for the rate of gas flowing through the inlet valve to reach a new steady state value; wherein the controller terminates the cleaning process after the new steady state value is reached.

According to another embodiment, a software program, disposed on a non-transitory computer readable storage media which is in communication with a processing unit in a controller, is disclosed. The software program comprises instructions, which when executed by the processing unit, enable the controller to: monitor a flow rate, or a parameter indicative of the flow rate, of a cleaning gas into or out of a processing chamber during a cleaning process; determine that the flow rate into or out of the processing chamber has changed; determine that the flow rate has reached a new steady state value; and terminate the cleaning process, after the new steady state value has been reached. In certain embodiments, terminating the cleaning process comprises disabling a flow of cleaning gas through an inlet valve or providing an indication to an operator. In certain embodiments, the processing chamber utilizes downstream pressure control, and the controller is in communication with a pendulum valve, the pendulum valve in communication with the processing chamber and a vacuum pump, and the software program further comprises instructions that enable the controller to: monitor a position of a pendulum plate in an outlet valve, wherein the position of the pendulum plate is indicative of a flow rate of cleaning gas out of the processing chamber. In certain embodiments, the processing chamber utilizes upstream pressure control, and the controller is in communication with an inlet valve, and the software program further comprises instructions that enable the controller to: monitor a rate of cleaning gas flowing through the inlet valve.

According to another embodiment, a system for cleaning a processing chamber is disclosed. The system comprises the processing chamber; a gas source; an inlet valve in communication with the gas source and the processing chamber to allow a flow of cleaning gas from the gas source into the processing chamber at a constant flow rate; a vacuum pump; an outlet valve in communication with the processing chamber and the vacuum pump to allow the flow of cleaning gas from the processing chamber at a constant flow rate; a pressure sensor in communication with the processing chamber; and a controller, wherein the controller is in communication with the pressure sensor and comprises a processing unit and a memory device, wherein the memory device comprises instructions, which when executed by the processing unit, enable the controller to: monitor a pressure within the processing chamber while cleaning gas is flowing into the processing chamber through the inlet valve during a cleaning process; and terminate the cleaning process based on changes to the pressure. In certain embodiments, terminating the cleaning process comprises disabling the flow of cleaning gas through the inlet valve or providing an alert to an operator. In some embodiments, the memory device comprises instructions, which when executed by the processing unit, enable the controller to: determine that the pressure within the processing chamber has started increasing; and wait for the pressure to reach a new steady state value; wherein the controller terminates the cleaning process after the new steady state value is reached.

BRIEF DESCRIPTION OF THE FIGURES

For a better understanding of the present disclosure, reference is made to the accompanying drawings, which are incorporated herein by reference and in which.

DETAILED DESCRIPTION

As described above, in many applications, it is advantageous to determine when the cleaning of a processing chamber is complete. Therefore, a system that can be used to make this determination without expensive instrumentation or complex analysis would be beneficial.

In certain embodiments, the present disclosure describes a system and method where the flow of gas into or out of the processing chamber is monitored. Variations in this flow rate are then used to determine when the cleaning process is complete. There are two configurations that may be used to maintain the pressure within a processing chamber. In an upstream pressure control configuration, the flow of cleaning gas into the processing chamber is regulated so as to maintain a constant pressure within the processing chamber. In a downstream pressure control configuration, the flow of gas out of the processing chamber is regulated as to as maintain a constant pressure within the processing chamber. Each of these configurations is described in more detail below.

During the cleaning process, the pressure within the processing chamber remains relatively constant as residual material is being removed from the interior surfaces of the processing chamber. However, as the interior surfaces are cleaned, there is less residual material on the interior surfaces to interact with the halogen gas. As a result, the amount of halogen gas within the processing chamber increases. To maintain a constant pressure within the processing chamber, in the case of an upstream pressure control configuration, less gas enters the processing chamber. In the case of a downstream pressure control configuration, more gas exits the processing chamber to maintain the pressure at a constant value. Eventually, the flow rate into and out of the processing chamber reaches a new steady state value. This may be indicative that the cleaning process may be complete. A controller may be used to monitor the flow rate into or out of the processing chamber, either directly or via a signal that is indicative of flow rate.

Figure 1:
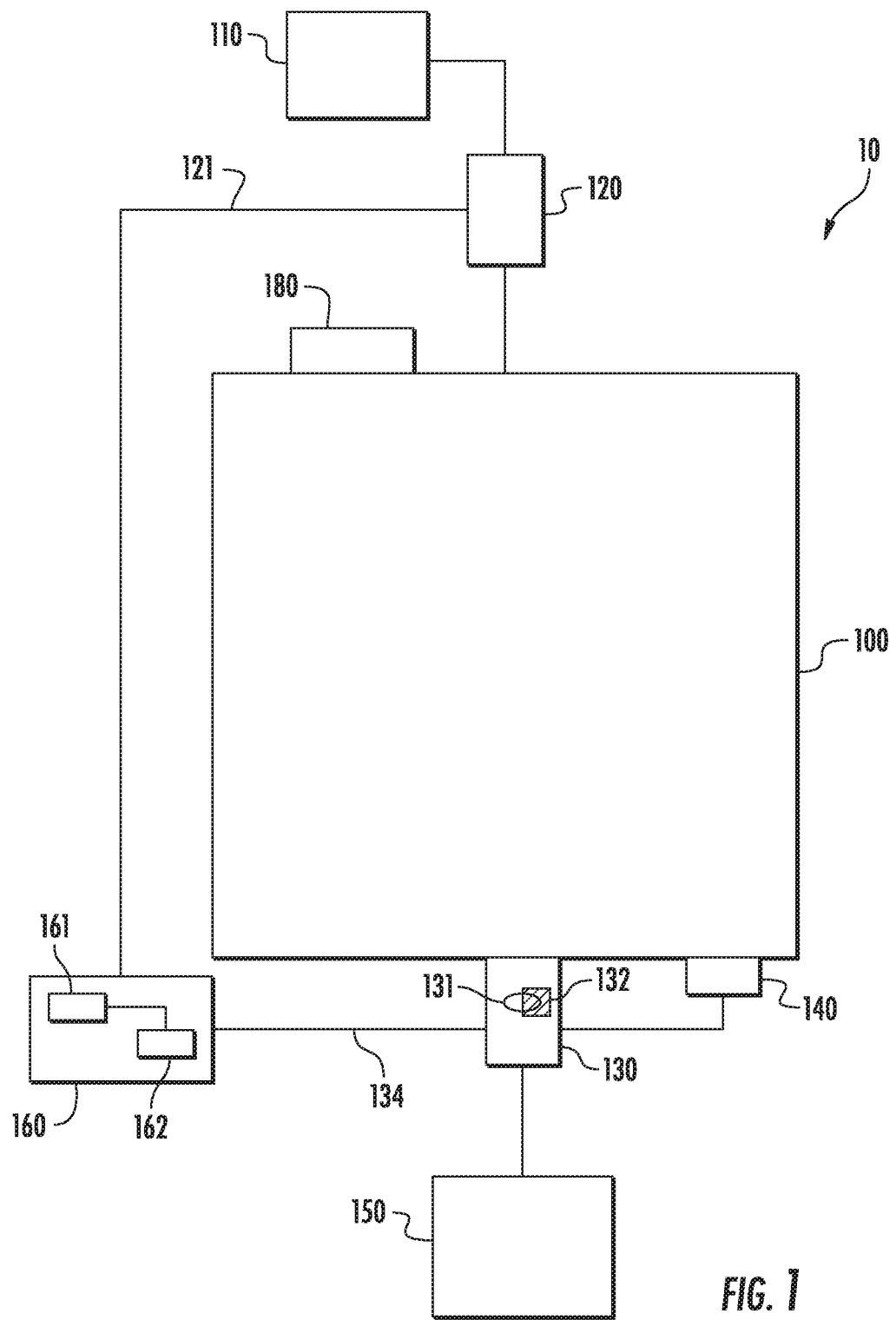
FIG. 1 is a downstream pressure control system that may be used to determine when a cleaning process is complete according to one embodiment.

FIG. 1 shows a side view of the system 10 that utilizes downstream pressure control to determine when the cleaning process is complete. The system 10 includes a processing chamber 100. This processing chamber 100 is typically maintained at near vacuum conditions, such as between 2 and 1000 mTorr. This processing chamber 100 may be used to process semiconductor workpieces. For example, the processing chamber 100 may be used for ion implantation, deposition, amortization, heating, cooling, etching or sputtering processes. In certain embodiments, a plasma source 180, such as an antenna that is supplied with RF power, may be located proximate the processing chamber 100 to create a plasma within the processing chamber 100. In other embodiments, a workpiece support may be disposed within the processing chamber 100. The workpiece support may be capable of holding the workpiece in place, such as by electrostatic force. In addition, in certain embodiments, the workpiece support may be capable of supplying a bias voltage to the workpiece. The function of the processing chamber 100 and the components that are located in or near the processing chamber 100 are not limited by this disclosure.

The processing chamber 100 may be in fluid communication with a gas source 110. The gas source 110 may contain a cleaning gas, such as a halogen containing species. One such halogen containing species is $NF_3$, although other species are also possible. The gas source 110 may be in fluid communication with an inlet valve 120 that allows the flow of the cleaning gas from the gas source 110 into the processing chamber 100. In certain embodiments, the inlet valve 120 may be a mass flow controller (MFC), which controls the flow rate of the cleaning gas into the processing chamber 100. In a downstream pressure control configuration, the flow rate through the inlet valve 120 is held constant.

In this embodiment, an outlet valve 130 is in communication with an outlet of the processing chamber 100. The outlet valve 130 is also in fluid communication with a vacuum pump 150. The outlet valve 130 has an adjustable opening 131 that varies the rate at which gas passes from the processing chamber 100 through the vacuum pump 150. In one embodiment, the outlet valve 130 is in communication with a pressure sensor 140, which monitors the pressure within the processing chamber 100. The outlet valve 130 varies the size of the opening 131 to maintain the pressure within the processing chamber 100 at a predetermined value.

In one embodiment, the outlet valve 130 is a pendulum valve. This type of valve has an opening 131 and a movable pendulum plate 132 that can be manipulated to cover a portion or all of the opening 131. The pendulum plate 132 is manipulated based on the measurement obtained from the pressure sensor 140 so as to maintain the processing chamber 100 at a desired pressure.

A signal 134 from the outlet valve 130, which may be digital or analog, is provided to a controller 160. This signal 134 is indicative of the rate at which gas is flowing through the outlet valve 130. In certain embodiments, the signal represents the position of the pendulum plate 132 in the pendulum valve. For example, a maximum value of the signal 134 may indicate that the pendulum plate 132 is in its maximum open position, while the minimum value of the signal 134 may indicated that the outlet valve 130 is fully closed.

The controller 160 includes a processing unit 161 and a memory device 162. The processing unit 161 may be any suitable component, such as a microprocessor, embedded processor, an application specific circuit, a programmable circuit, a microcontroller, or another similar device. This memory device 162 is in electrical communication with the processing unit 161 and contains the instructions, which, when executed by the processing unit 161, enable the controller 160 to perform the functions described herein. This memory device 162 may be a non-volatile memory, such as a FLASH ROM, an electrically erasable ROM or other suitable devices. In other embodiments, the memory device 162 may be a volatile memory, such as a RAM or DRAM.

The controller 160 may also be in communication with the inlet valve 120. The controller 160 may energize the inlet valve 120 to start and terminate the cleaning process, as described in more detail below. In other embodiments, the inlet valve 120 may be manually operated.

Figure 2:
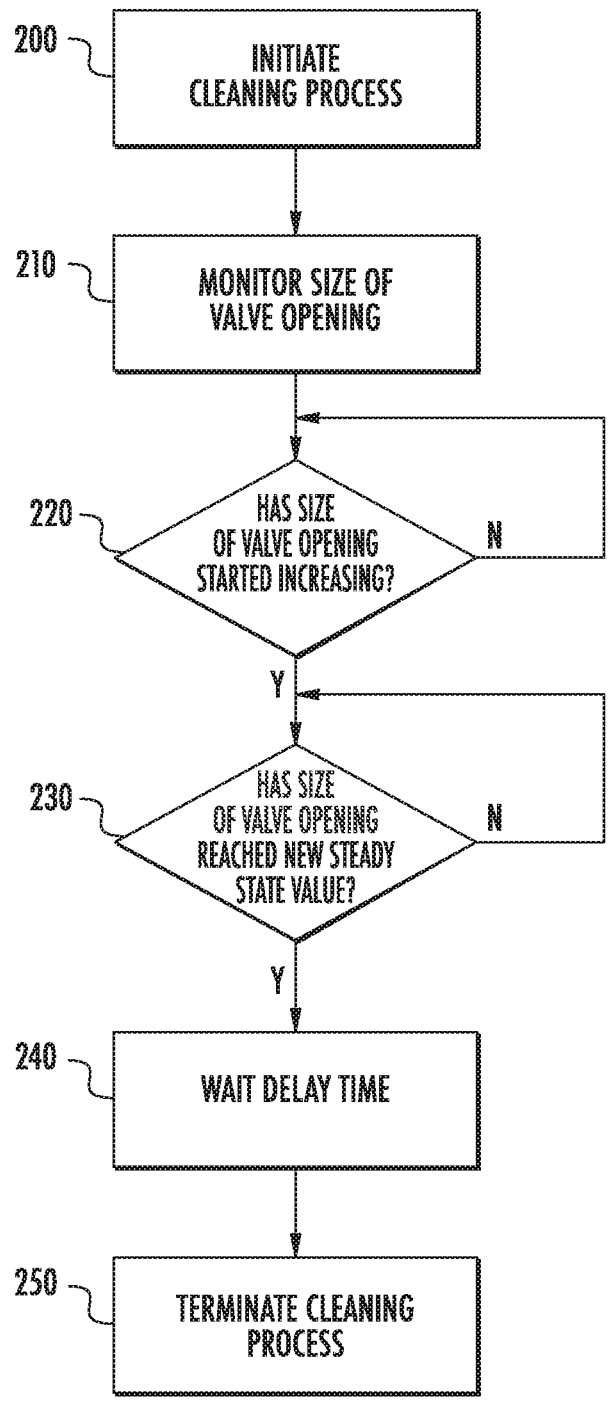
FIG. 2 is a representative flow chart showing the sequence used with the system of FIG. 1 to determine when the cleaning process is complete.

FIG. 2 shows a sequence that the controller 160 may execute to perform a cleaning process. In certain embodiments, the sequence shown in FIG. 2 may be disposed in a software program, which is stored in a non-transitory computer-readable storage media, such as the memory device 162 of the controller 160. Thus, when executed by the processing unit 161, the software program, enables the controller 160 to perform the sequence shown in FIG. 2.

First, as shown in Process 200, a cleaning process is initiated. For example, the controller 160 may supply a signal 121, either digital or analog, that opens the inlet valve 120. In other embodiments, the inlet valve 120 may be manually controlled to begin the cleaning process. In certain embodiments, the inlet valve 120 supplies the cleaning gas to the processing chamber 100 at a constant flow rate.

After the cleaning gas begins flowing into the processing chamber 100, the outlet valve 130 begins adjusting the size of its opening to maintain a constant cleaning pressure. In certain embodiments, this cleaning pressure is between 10 and 800 mTorr.

Once the pressure is stable, the RF power is enabled such that a plasma is generated within the processing chamber 100. This begin the cleaning process.

The controller 160 then monitors the size of the opening 131 in the outlet valve 130, as shown in Process 210. In certain embodiments, the controller 160 receives data from the outlet valve 130 once per second or faster. As explained above, the size of the opening 131 is related to the pressure detected within the processing chamber 100. In other words, the pendulum plate 132 moves to vary the size of the opening 131. This movement of the pendulum plate 132 maintains the pressure within the processing chamber 100 at the predetermined value and the controller 160 is able to determine the position of the pendulum plate 132 via signal 134. Thus, by monitoring the position of the pendulum plate 132, the controller 160 is able to monitor the flow rate of gas exiting the processing chamber 100. In other words, monitoring the size of the opening in the valve may comprise monitoring the position of the pendulum plate 132 in the pendulum valve.

During the early stages of the cleaning process, the pressure within the processing chamber 100 remains relatively constant such that the flow of cleaning gas from the processing chamber 100 is relatively constant. Therefore, the position of the pendulum plate 132 remains relatively constant. The controller 160 continues monitoring the size of the opening 131 until the opening 131 begins increasing in size, as shown in Process 220. This may be represented by an increase in the position of the pendulum plate 132, where the position of the pendulum plate 132 may be represented as a percentage of the opening 131 that is uncovered.

This change in the position of the pendulum plate 132 indicates that the amount of halogen gas in the processing chamber 100 is starting to increase. This is indicative that the interior surfaces of the processing chamber 100 are nearly clean. In other words, since there is less residual material in the processing chamber 100, less of the halogen gas is consumed. This results in an increase in the amount of halogen gas in the processing chamber 100. To compensate for this increase in the amount of halogen gas in the processing chamber 100, the pendulum plate 132 opens wider to allow more gas to be exhausted through vacuum pump 150. The controller 160 continues monitoring the size of the opening 131 until it reaches a new steady state value, as shown in Process 230. Throughout this disclosure, the term "steady state value" denotes a situation where measurements are within 10% of each other over a duration of 60 seconds (or the value changes less than 10% over a duration of 60 seconds). In certain embodiments, the term "steady state value" denotes a situation where measurements are within 5% of each other over a duration of 60 seconds (or the value changes less than 5% over a duration of 60 seconds). This may be indicative that the cleaning process may be complete.

In certain embodiments, after the size of the opening 131 has reached a new steady state value, the controller 160 waits a predetermined delay time, as shown in Process 240. After the delay time, the controller 160 terminates the cleaning process, as shown in Process 250. Terminating the cleaning process may include supplying a signal 121 to the inlet valve 120 that terminates the flow of cleaning gas to the processing chamber 100. In another embodiment, terminating the cleaning process may include providing an indication, such as a visual or auditory indication, to an operator. In other embodiments, the controller 160 does not wait a predetermined wait time and proceeds directly from Process 230 to Process 250.

Figure 3:
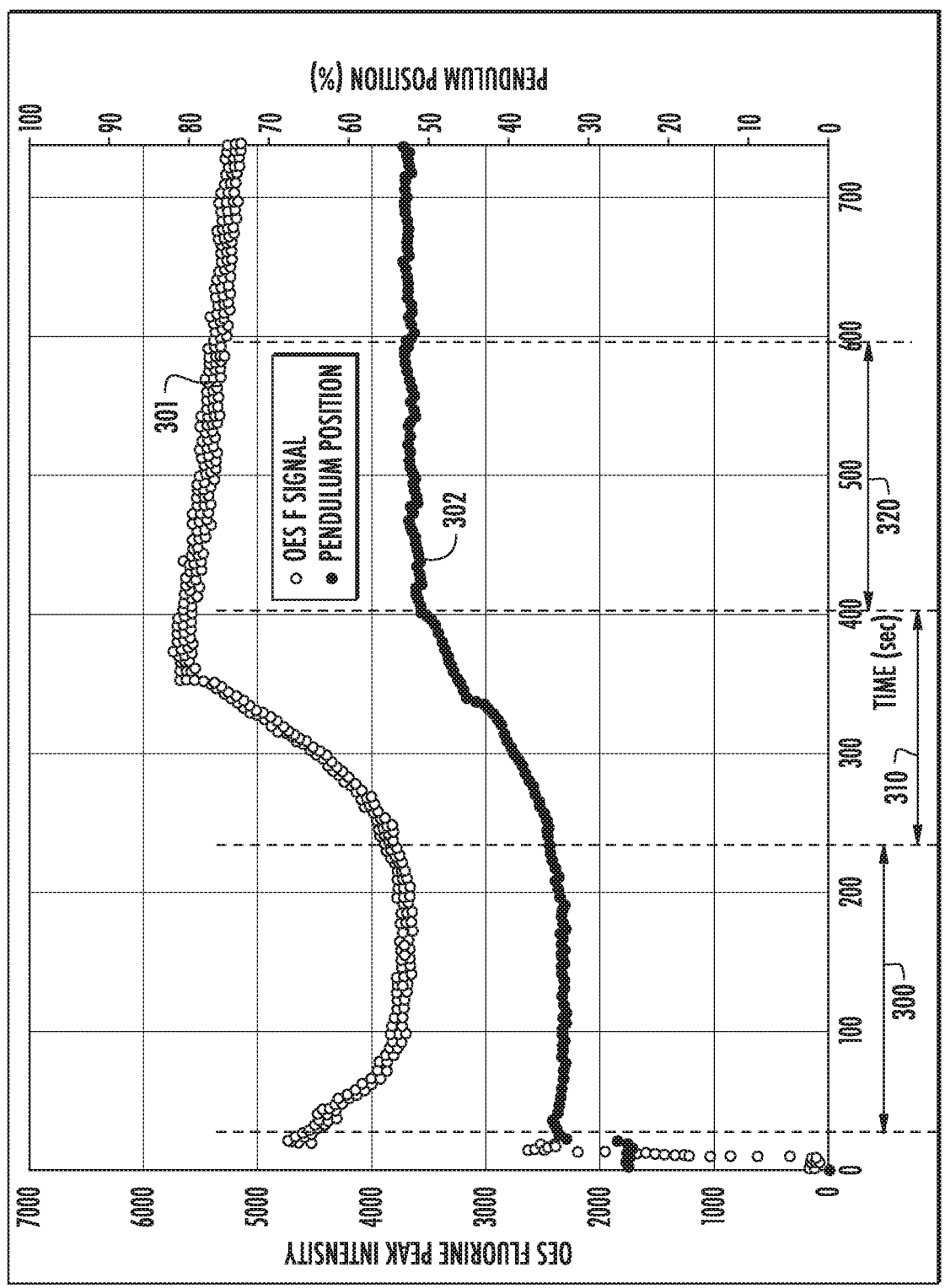
FIG. 3 is a graph showing the amount of fluorine in the processing chamber, as measured using an OES system, as compared to the position of the pendulum.

FIG. 3 shows a graph that compares the OES signal observed during a cleaning process, to the position of the pendulum plate 132 of outlet valve 130. As expected, the OES signal 301 increases as the cleaning process nears completion, as more free fluorine is disposed within the processing chamber 100. However, unexpectedly, the position of the pendulum plate 132 within the outlet valve 130, shown in line 302, shows a similar trend.

Specifically, the pendulum position stays relatively constant during first time duration 300. This corresponds to Process 220, where the controller 160 monitors the size of the opening 131 waiting for an increase in the size of the opening 131. During the first time duration 300, the halogen gas is being consumed by the residual material on the interior surfaces, and thus, the pressure within the processing chamber 100 remains relatively constant.

Next, the position of the pendulum plate 132 moves so that the size of the opening 131 increases and continues increasing throughout second time duration 310. As explained above, the position of the pendulum plate 132 may be represented as a percentage, where 100% indicates that the pendulum valve is completely open and 0% indicates that the pendulum valve is completely closed.

During this second time duration 310, the residual material is nearly cleaned. Thus, less and less of the halogen gas is being consumed by this residual material, and more of the halogen gas is being exhausted from the processing chamber 100. To maintain the pressure within the processing chamber 100 and exhaust this excess halogen gas, the pendulum moves to a more open position.

The position of the pendulum plate 132 eventually reaches a new steady state value, as shown in third time duration 320. This new steady state value is greater than the initial value during first time duration 300. This is because little or none of the halogen gas is being consumed by the residual material. Thereafter, the pendulum plate 132 of the outlet valve 130 remains at this new position. During the third time duration 320, the cleaning process is complete and the controller 160 may terminate the cleaning process.

As noted above, upstream pressure control may also be employed to determine when the cleaning process is complete.

Figure 4:
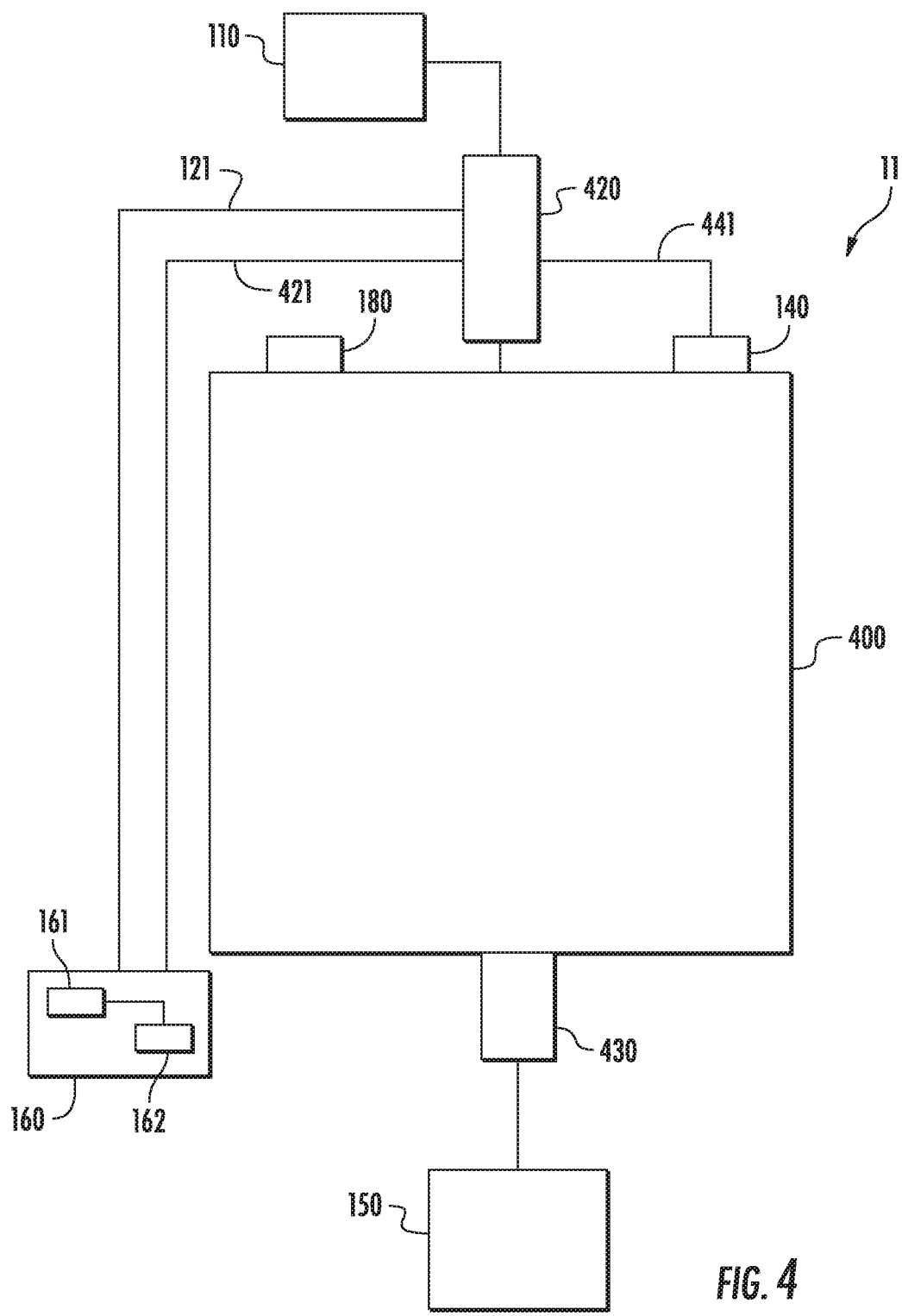
FIG. 4 is an upstream pressure control system that may be used to determine when a cleaning process is complete according to one embodiment.

FIG. 4 shows a system 11 that utilizes upstream pressure control that can be used to determine when to terminate a cleaning process. In this system 11, the gas source 110 is as described above. The outlet valve of FIG. 1 is replaced with an outlet valve 430 that passes a fixed flow rate of gas through the vacuum pump 150. The inlet valve of FIG. 1 is replaced with inlet valve 420, which is able to vary the flow of cleaning gas into the processing chamber 400. The inlet valve 420 receives a signal 441 from the pressure sensor 140. This signal 441 may be either digital or analog. The inlet valve 420 is any valve that is able to vary the flow of gas passing from the gas source 110 to the processing chamber 400 based on the signal 441. In one embodiment, the inlet valve 420 may be a proportional valve. In other words, the pressure within the processing chamber 400 is maintained by regulating the flow of cleaning gas into the processing chamber 400. In certain embodiments, the inlet valve 420 may be more than a single component.

In this embodiment, the controller 160 may receive a signal 421, either digital or analog, from the inlet valve 420. This signal 421 may be an indication of the rate at which cleaning gas is flowing through the inlet valve 420 into the processing chamber 400. In another embodiment, this signal 421 may be the same as signal 441. In this embodiment, during a cleaning process, the flow rate into the processing chamber 400 will be relatively constant as the interior surfaces of the processing chamber 400 are being cleaned. However, as the amount of residual material on the interior surfaces decreases, there will be more free halogen gas. To counteract this increase in the amount of gas within the processing chamber 400, the inlet valve 420 will decrease the flow rate of cleaning gas entering the processing chamber 400. The controller 160 will detect this decrease in the flow rate of gas entering the processing chamber 400. Once the flow rate of gas entering the processing chamber 400 reached a new steady state value, the controller 160 will terminate the cleaning process. This may be done by providing a signal 121 to the inlet valve 420, as described above, or by alerting an operator.

Figure 5:
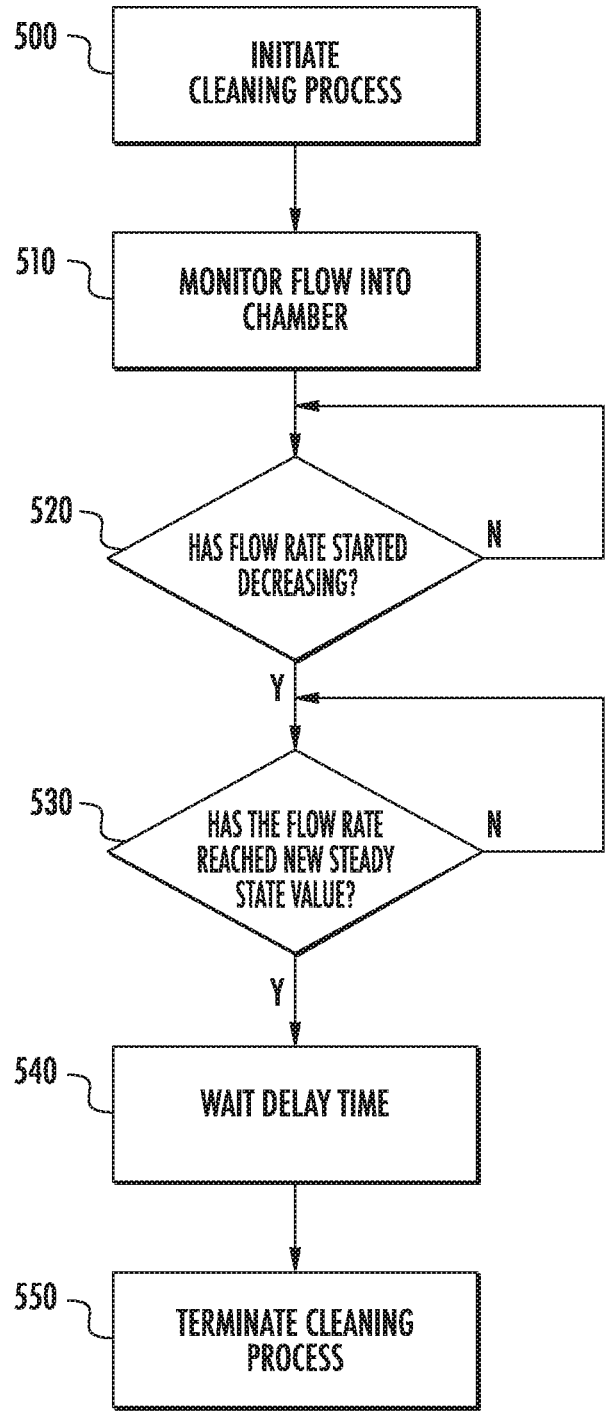
FIG. 5 is a representative flow chart showing the sequence used with the system of FIG. 4 to determine when the cleaning process is complete.

FIG. 5 shows a sequence that the controller 160 may execute to perform a cleaning process using the system of FIG. 4. In certain embodiments, the sequence shown in FIG. 5 may be disposed in a software program, which is stored in a non-transitory computer readable storage media, such as the memory device 162 of the controller 160. Thus, when executed by the processing unit 161, the software program, enables the controller 160 to perform the sequence shown in FIG. 5.

First, as shown in Process 500, a cleaning process is initiated. For example, in one embodiment, the controller 160 may supply a signal 121, either digital or analog, that opens the inlet valve 420. In another embodiment, the inlet valve 420 may be opened manually. Cleaning gas then flows through the inlet valve 420 and into the processing chamber 400.

After the cleaning gas begins flowing into the processing chamber 400, the inlet valve 420 begins adjusting the flow rate to maintain a constant cleaning pressure. In certain embodiments, this cleaning pressure is between 10 and 800 mTorr.

Once the pressure is stable, the RF power is enabled such that a plasma is generated within the processing chamber 400. This begins the cleaning process.

The controller 160 then monitors the flow rate of cleaning gas through the inlet valve 420, as shown in Process 510. In certain embodiments, the controller 160 receives data from the inlet valve 420 once per second or faster. As explained above, the flow rate of cleaning gas entering the processing chamber 400 is related to the pressure detected within the processing chamber 400.

During the early stages of the cleaning process, the pressure within the processing chamber 400 remains relatively constant such that the flow of cleaning gas into the processing chamber 400 is relatively constant. Therefore, the flow rate into the processing chamber 400 remains relatively constant. The controller 160 continues monitoring the flow rate into the processing chamber 400 until it begins decreasing, as shown in Process 520. This indicates that the amount of halogen gas in the processing chamber 400 is starting to increase. This is indicative that the interior surfaces are nearly clean. In other words, since there is less residual material in the processing chamber 400, less of the halogen gas is consumed. This results in an increase in the amount of halogen gas in the processing chamber 400. To compensate for this increase in the amount of halogen gas in the processing chamber 100, the inlet valve 420 regulates to allow less cleaning gas to be introduced into the processing chamber 400. The controller 160 continues monitoring the flow rate until it reaches a new steady state value, as shown in Process 530. This may be indicative that the cleaning process may be complete.

In certain embodiments, after the flow rate has reached a new steady state value, the controller 160 waits a predetermined delay time, as shown in Process 540. After the delay time, the controller 160 terminates the cleaning process, as shown in Process 550. Terminating the cleaning process may include supplying a signal 121 to the inlet valve 120 that terminates the flow of cleaning gas to the processing chamber 400. In another embodiment, terminating the cleaning process may include providing an indication, such as a visual or auditory indication, to an operator. In certain embodiments, the sequence may move directly from Process 530 to Process 550 without waiting a delay time.

Thus, in certain embodiments, the present disclosure describes a system, software program and method where the flow of cleaning gas into or out of the processing chamber is monitored. This may be accomplished for both an upstream pressure control configuration and a downstream pressure control configuration. Variations in this flow rate are then used to determine when the cleaning process is complete.

Figure 6:
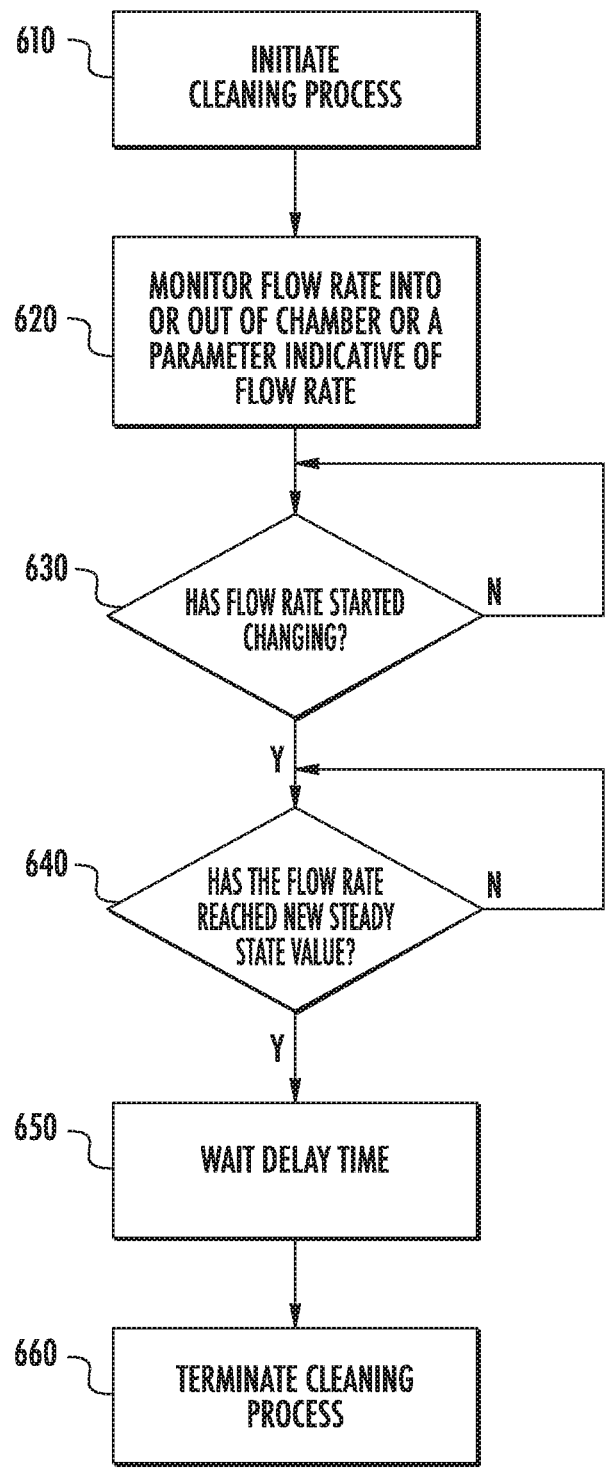
FIG. 6 is a flow chart showing a method of determining when the cleaning process is complete using the systems of FIG. 1 and FIG. 4.

FIG. 6 shows a flowchart of the concept of using flow rate to determine when a cleaning process is complete. In certain embodiments, the sequence shown in FIG. 6 may be disposed in a software program, which is stored in a non-transitory computer readable storage media, such as the memory device 162 of the controller 160. Thus, when executed by the processing unit 161, the software program, enables the controller 160 to perform the sequence shown in FIG. 6.

First, as shown in Process 610, the cleaning process is initiated. This is achieved by allowing the flow of cleaning gas into the processing chamber. The cleaning gas may include a halogen, such as chlorine or fluorine. The flow rate into and/or out of the processing chamber is then monitored, as shown in Process 620. In certain embodiments, the controller may obtain actual flow rate values. In other embodiments, the controller may receive values that are indicative of the flow rate. For example, for a pendulum valve, the position of the pendulum plate in the valve is indicative of the flow rate. For example, for a proportional valve, the signal supplied to the proportional valve may be indicative of the flow rate into the processing chamber. Thus, throughout this disclosure, the flow rate monitored by the controller may be the actual value or a parameter that is indicative of the flow rate. When the cleaning process begin, the flow rates remain relatively constant. As the interior surface get cleaned, the flow rate changes, as shown in Process 630. This may be an increase in the flow rate of gas being exhausted, or a decrease in the flow rate of gas being introduced into the processing chamber. These flow rates are then monitored until a new steady state value is reached, as shown in Process 640. Once a new steady state value has been reached, the system may wait a delay time, as shown in Process 650. After the delay time, the cleaning process is terminated, as shown in Process 660.

As noted above, this method may be executed by either monitoring the exhaust flow rate, which is known as downstream pressure control, or by monitoring the intake flow rate, which is known as upstream pressure control.

However, other embodiments are also possible. For example, the flow rate of cleaning gas entering and exiting the processing chamber may be held constant. In this embodiment, a change in pressure may occur within the processing chamber. A system that utilizes this concept is shown in FIG. 7.

This system 12 shows a processing chamber 700. A gas source 110 is in communication with an inlet valve 120, which is as described above with respect to FIG. 1. In this embodiment, the flow rate of cleaning gas entering the processing chamber 700 is maintained at a constant value. The outlet valve 430, which is as described with respect to FIG. 4, is in communication with the vacuum pump 150. The outlet valve 430 passes a fixed flow rate of gas through the vacuum pump 150. Thus, in this embodiment, the flow rate of cleaning gas entering and exiting the processing chamber 700 remains constant.

Because there is no change in either flow rate, the pressure within the processing chamber 700 increases as the cleaning process nears completion. This internal pressure is monitored using pressure sensor 740. Pressure sensor 740 has a signal 741 that is supplied to the controller 160. This signal 741, which maybe analog or digital, provides an indication to the controller 160 of the pressure within the processing chamber 700. As in the embodiments described above, the controller 160 may have a signal 121 that is transmitted to the inlet valve 120.

Figure 7:
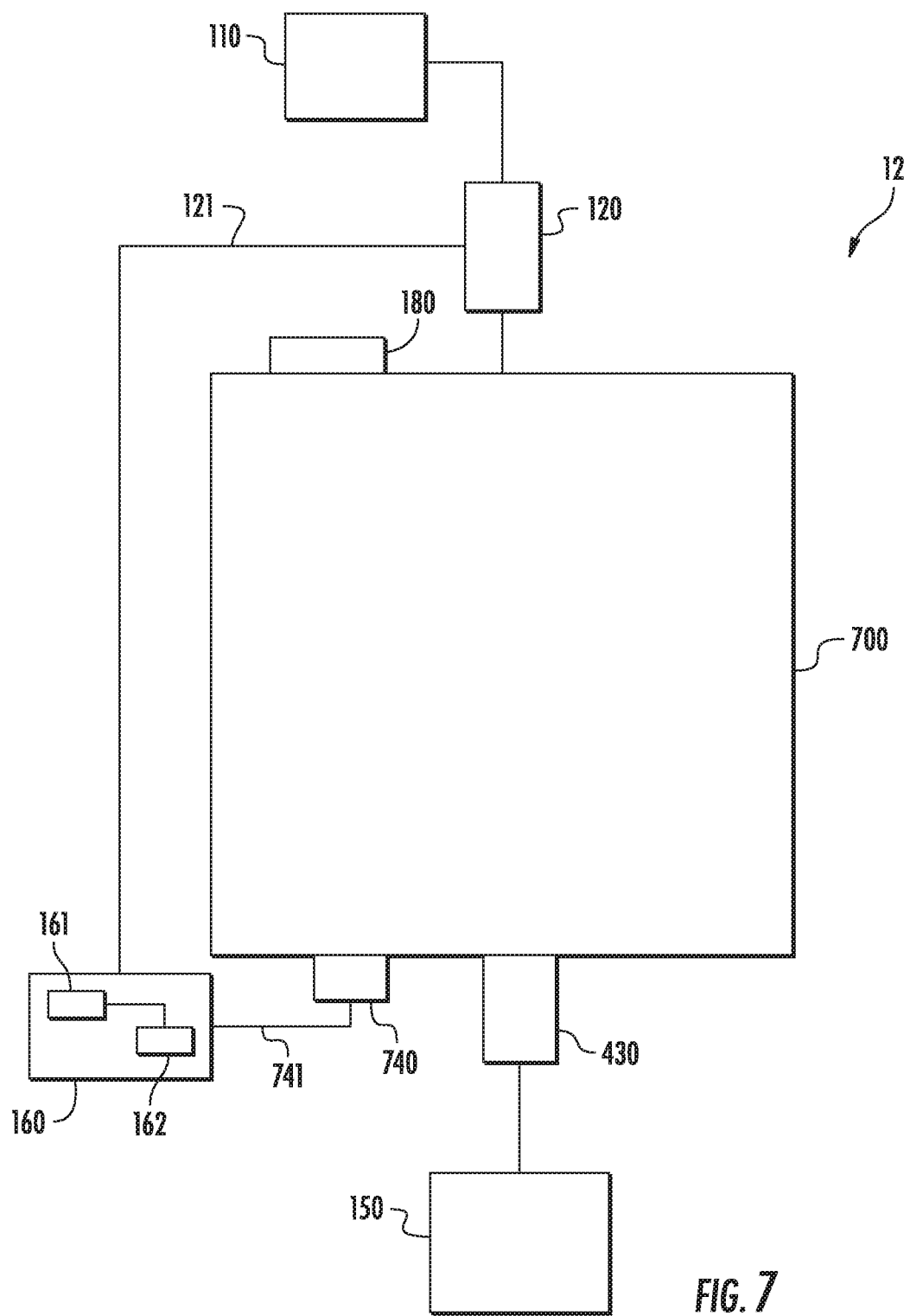
FIG. 7 is a system using a pressure sensor to determine when a cleaning process is complete according to another embodiment.
Figure 8:
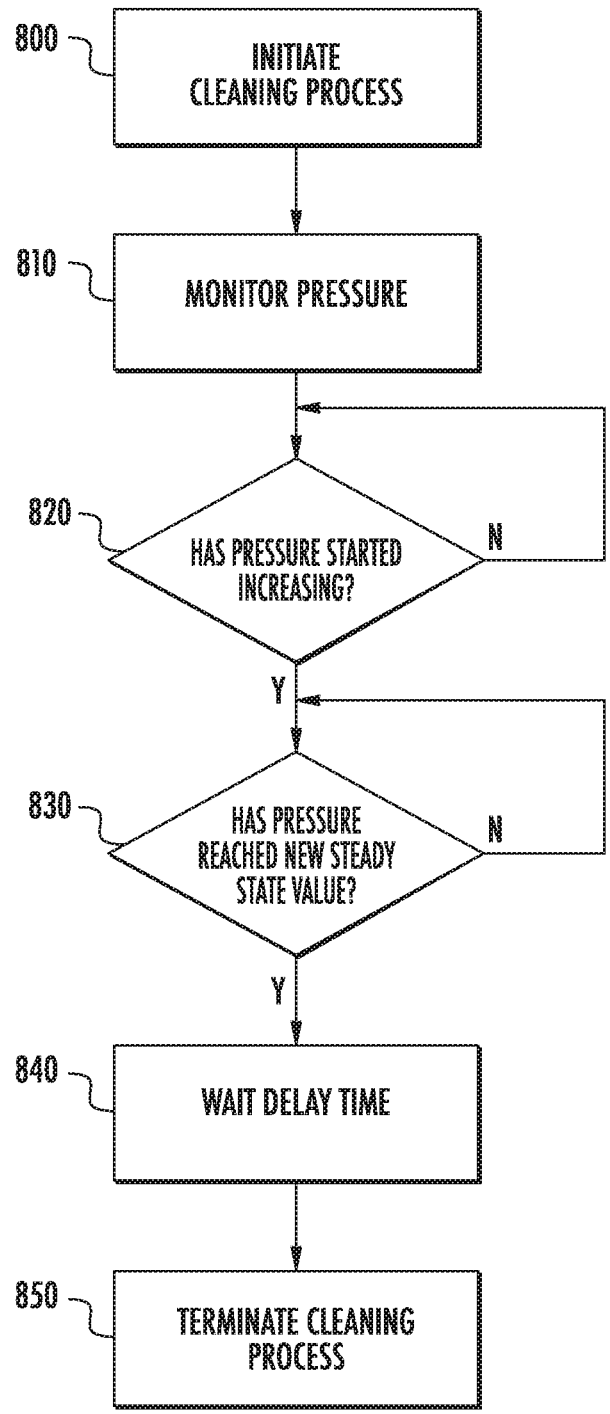
FIG. 8 is a representative flow chart showing the sequence used with the system of FIG. 7 to determine when the cleaning process is complete.

FIG. 8 shows a sequence that the controller 160 may execute to perform a cleaning process using the system of FIG. 7. First, as shown in Process 800, a cleaning process is initiated. For example, the controller 160 may supply a signal 121, either digital or analog, that opens the inlet valve 120. In another embodiment, the inlet valve 120 is manually actuated to start the cleaning process. Cleaning gas then flows through the inlet valve 120 and into the processing chamber 700.

After the cleaning gas begins flowing into the processing chamber 700, the RF power is enabled such that a plasma is generated within the processing chamber 700. This begin the cleaning process.

The controller 160 then monitors the pressure within processing chamber 700 using the pressure sensor 740, as shown in Process 810. As explained above, the pressure within the processing chamber 700 is related to the amount of residual material that is disposed on the interior surfaces. Thus, in this embodiment, as the halogen gas is no longer consumed by the residual material, the amount of halogen gas increases, resulting in an increase in the internal pressure of the processing chamber 700. The controller 160 monitors the pressure until it begins to increase, as shown in Process 820. In certain embodiments, the pressure may be monitored as frequently as 20 times per second. The controller 160 then waits until the pressure reaches a new steady state value, as shown in Process 830. After the pressure has stabilized, the controller 160 may wait a delay time, as shown in Process 840. The controller 160 then terminates the cleaning process, as shown in Process 850. Terminating the cleaning process may include supplying a signal 121 to the inlet valve 120 that terminates the flow of cleaning gas to the processing chamber 400. In another embodiment, terminating the cleaning process may include providing an indication, such as a visual or auditory indication, to an operator.

The embodiments described above in the present application may have many advantages. First, the present system allows for the proper termination of a cleaning process. This ensures that all of the residual material is removed, but the interior surfaces of the processing chamber are not attacked by the halogen gas. Second, this system utilizes, in many cases, existing components in a novel configuration. Thus, additional instrumentation, such as an OES or RGA system, is not employed, saving cost and complexity. Finally, the system achieves results that are comparable to those achieved using the more expensive OES and RGA systems.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A system for cleaning a processing chamber comprising:
   the processing chamber;
   a gas source containing a cleaning gas;
   an inlet valve in communication with the gas source and the processing chamber to allow a flow of the cleaning gas from the gas source into the processing chamber;
   a vacuum pump;
   an outlet valve in communication with the processing chamber and the vacuum pump to allow a flow of cleaning gas from the processing chamber;
   a pressure sensor; and
   a controller, wherein the controller comprises a processing unit and a memory device, wherein the memory device comprises instructions, which when executed by the processing unit, enable the controller to:
   monitor a flow rate, or a parameter indicative of the flow rate, of the cleaning gas into or out of the processing chamber during a cleaning process; and
   terminate the cleaning process based on changes to the monitored flow rate or the parameter.

2. The system of claim 1, where terminating the cleaning process comprises disabling the flow of cleaning gas through the inlet valve or providing an alert to an operator.

3. The system of claim 1, wherein in an upstream pressure control configuration, the pressure sensor is in communication with the inlet valve to maintain a pressure within the processing chamber, and
   wherein in a downstream pressure control configuration, the pressure sensor is in communication with the outlet valve to maintain the pressure within the processing chamber.

4. The system of claim 3, wherein in the downstream pressure control configuration, the controller is in communication with the outlet valve.

5. The system of claim 4, wherein the outlet valve supplies an output indicative of the flow rate through the outlet valve.

6. The system of claim 5, wherein the outlet valve is a pendulum valve.

7. The system of claim 6, wherein the output comprises a position of a pendulum plate, which defines a size of an opening in the pendulum valve and is indicative of the flow rate through the outlet valve.

8. The system of claim 7, wherein the memory device comprises instructions, which when executed by the processing unit, enable the controller to:
   monitor the position of the pendulum plate in the pendulum valve;
   determine that the position of the pendulum plate has started changing; and
   wait for the position of the pendulum plate to reach a new steady state value;
   wherein the controller terminates the cleaning process after the new steady state value is reached.

9. The system of claim 3, wherein in the upstream pressure control configuration, the controller is in communication with the inlet valve.

10. The system of claim 9, wherein the memory device comprises instructions, which, when executed by the processing unit, enable the controller to:
    monitor a rate of gas flowing through the inlet valve;
    determine that the rate of gas flowing through the inlet valve has started decreasing; and
    wait for the rate of gas flowing through the inlet valve to reach a new steady state value;
    wherein the controller terminates the cleaning process after the new steady state value is reached.

11. A software program, disposed on a non-transitory computer readable storage media, the storage media in communication with a processing unit in a controller, the software program comprising instructions, which when executed by the processing unit, enable the controller to:
    monitor a flow rate, or a parameter indicative of the flow rate, of a cleaning gas into or out of a processing chamber during a cleaning process;
    determine that the flow rate into or out of the processing chamber has changed;
    determine that the flow rate has reached a new steady state value; and
    terminate the cleaning process, after the new steady state value has been reached.

12. The software program of claim 11, wherein terminating the cleaning process comprises disabling a flow of cleaning gas through an inlet valve or providing an indication to an operator.

13. The software program of claim 11, wherein the processing chamber utilizes downstream pressure control, and the controller is in communication with a pendulum valve, the pendulum valve in communication with the processing chamber and a vacuum pump, wherein the software program further comprises instructions that enable the controller to:

monitor a position of a pendulum plate in an outlet valve, wherein the position of the pendulum plate is indicative of a flow rate of cleaning gas out of the processing chamber.

14. The software program of claim 11, wherein the processing chamber utilizes upstream pressure control, and the controller is in communication with an inlet valve, wherein the software program further comprises instructions that enable the controller to:

monitor a rate of cleaning gas flowing through the inlet valve.

15. A system for cleaning a processing chamber, comprising:

the processing chamber;

a gas source;

an inlet valve in communication with the gas source and the processing chamber to allow a flow of cleaning gas from the gas source into the processing chamber at a constant flow rate;

a vacuum pump;

an outlet valve in communication with the processing chamber and the vacuum pump to allow the flow of cleaning gas from the processing chamber at a constant flow rate;

a pressure sensor in communication with the processing chamber; and a controller, wherein the controller is in communication with the pressure sensor and comprises a processing unit and a memory device, wherein the memory device comprises instructions, which when executed by the processing unit, enable the controller to:

monitor a pressure within the processing chamber while cleaning gas is flowing into the processing chamber through the inlet valve during a cleaning process; and terminate the cleaning process based on changes to the pressure.

16. The system of claim 15, where terminating the cleaning process comprises disabling the flow of cleaning gas through the inlet valve or providing an alert to an operator.

17. The system of claim 15, wherein the memory device comprises instructions, which when executed by the processing unit, enable the controller to:

determine that the pressure within the processing chamber has started increasing; and wait for the pressure to reach a new steady state value;

wherein the controller terminates the cleaning process after the new steady state value is reached.

* * * * *